United States Patent
Hsu

(10) Patent No.: US 8,179,076 B2
(45) Date of Patent: May 15, 2012

(54) CHIP STRUCTURE CAPABLE OF SMOOTHING SLOPE OF SIGNAL DURING CONVERSION

(75) Inventor: Lu-Yueh Hsu, Sinjhuang (TW)

(73) Assignee: dadny, Inc., Taipei (TW)

( * ) Notice: Subject to any disclaimer, the term of this patent is extended or adjusted under 35 U.S.C. 154(b) by 388 days.

(21) Appl. No.: 12/149,698

(22) Filed: May 7, 2008

(65) Prior Publication Data
US 2009/0160514 A1    Jun. 25, 2009

(30) Foreign Application Priority Data
Dec. 24, 2007 (TW) .............................. 96149800 A

(51) Int. Cl.
  *H03K 5/12* (2006.01)
  *G03B 13/00* (2006.01)
  *H01L 27/00* (2006.01)
(52) U.S. Cl. ......... 318/611; 318/600; 318/626; 318/558
(58) Field of Classification Search .................. 318/286, 318/293, 448, 504, 509, 558, 600, 611, 621, 318/623, 626, 632
See application file for complete search history.

(56) References Cited

U.S. PATENT DOCUMENTS

| | | | | |
|---|---|---|---|---|
| 4,284,341 A | * | 8/1981 | Yamada | 396/180 |
| 5,483,055 A | * | 1/1996 | Thompson et al. | 250/201.3 |
| 6,249,093 B1 | * | 6/2001 | Takahata et al. | 318/129 |

* cited by examiner

*Primary Examiner* — Bentsu Ro
(74) *Attorney, Agent, or Firm* — Wang Law Firm, Inc.; Li K. Wang

(57) ABSTRACT

The present invention discloses a chip structure capable of smoothing slope of signal during conversion. And the chip structure is suitable for a DC motor which is embedded in a portable electronic device. The DC motor is for adjusting the focal distance of a digital camera which is installed within the portable electronic device. The chip structure comprises an input terminal, a first converter, a control unit, a second converter, an amplifier circuit and an output terminal. The input terminal is for receiving a first digital signal. The first converter is for converting the first digital signal into an analog signal. The control unit is for elongating the transform time of the analog signal. The amplifier circuit is for amplifying the elongated analog signal. The second converter is for converting the elongated analog signal into a second digital signal. And the output terminal outputs the second digital signal.

10 Claims, 3 Drawing Sheets

US 8,179,076 B2

CHIP STRUCTURE CAPABLE OF SMOOTHING SLOPE OF SIGNAL DURING CONVERSION

BACKGROUND OF THE INVENTION (a) Field of the Invention

The present invention relates to a chip structure capable of smoothing slope of signal during conversion, and, more particularly, to a chip structure capable of elongating the input time of a signal to obtain the effect of smoothing the signal.

(b) Description of the Prior Art

Mobile phones have become a widely used electronic product at the present day. The demand for mobile phones not only lies in fashionable and novel appearance with particular design, but also it is fastidious about the functions thereof. For that reason, the mobile phones with the functions of digital cameras have been commercially available for a long time.

The digital camera combined within a conventional mobile phone has a function of adjusting the focal distance of the digital camera. The function of adjusting the focal distance is performed by a voice coil motor to obtain the best photographic effect. However, the driving signals received by the motor are used for moving straight up or straight down, so that the motor would be instantaneously turned on and off. And this would result in an unwanted and easily heard noise when the mobile phone is in use.

In view of the drawbacks of the prior art, the inventors propose a chip structure capable of smoothing slope of signal during conversion based on their research and development for many years and plenty of practical experience in order to improve the above drawbacks.

SUMMARY OF THE INVENTION

In view of the above-mentioned drawbacks, the objective of the present invention is to provide a chip structure capable of smoothing slope of signal during conversion in order to reduce the noise generated while the motor is driven.

According to the object of the present invention, a chip structure capable of smoothing slope of signal during conversion is provided. The chip structure is applied for a DC motor which is embedded in a portable electronic device for adjusting the focal distance of a digital camera installed within the portable electronic device. The chip structure comprises an input terminal, a first converter, a control unit, a second converter, an amplifier circuit and an output terminal. The input terminal is for receiving a first digital signal and the first converter is for converting the first digital signal into an analog signal. The control unit is for elongating the transform time of the analog signal. The amplifier circuit is for amplifying the elongated analog signal. The second converter is for converting the analog signal with the elongated transform time into a second digital signal and the amplified second digital signal is outputted by the output terminal.

The technical features and effects of the present invention may be better understood and appreciated through the preferred embodiment of the present invention described in more detail below.

BRIEF DESCRIPTION OF THE DRAWINGS

The chip structure capable of smoothing slope of signal during conversion according to the preferred embodiment of the present invention is described with reference to the related drawings. For the convenience of understanding, the same reference numerals as in the following embodiment designate the same elements.

DETAILED DESCRIPTION OF THE PREFERRED EMBODIMENTS

Figure 1:
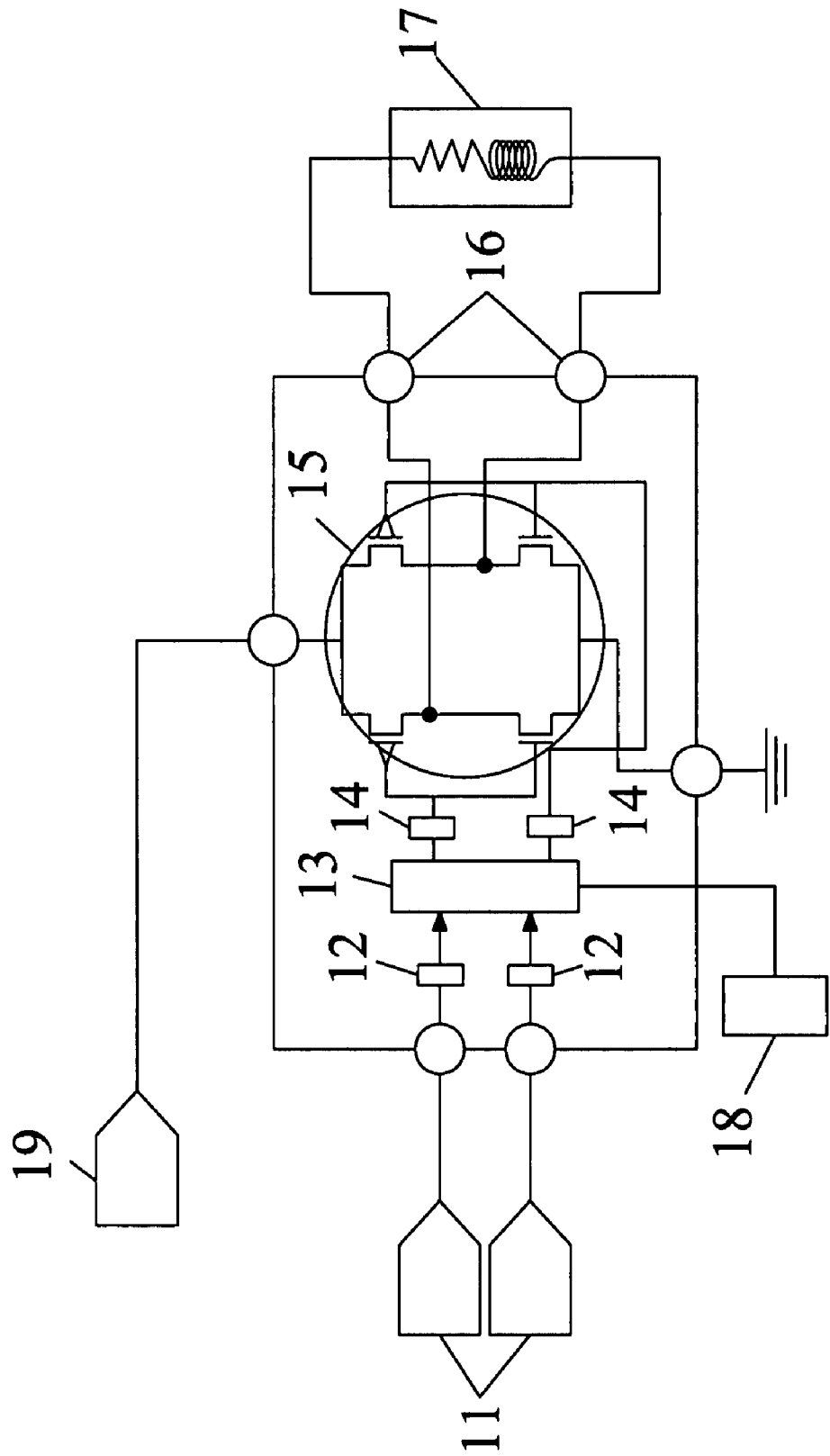
FIG. 1 is a schematic view showing a chip structure capable of smoothing slope of signal during conversion according to the present invention.

FIG. 1 illustrates a schematic view showing a chip structure capable of smoothing slope of signal during conversion according to the present invention. The chip structure capable of smoothing slope of signal during conversion is applied for a DC motor 17 which is embedded in a portable electronic device. The portable electronic device can be a mobile phone, an iPhone, or a personal digital assistant (PDA), or the like. The DC motor 17 is for adjusting the focal distance of a digital camera which is installed within the portable electronic device. The chip structure capable of smoothing slope of signal during conversion comprises an input terminal 11, a first converter 12, a control unit 13, a second converter 14, an amplifier circuit 15 and an output terminal 16. The input terminal 11 is for receiving a first digital signal which is for driving the DC motor 17. The first converter 12 is for converting the first digital signal into an analog signal. Preferably, the first converter 12 is a digital-to-analog (D/A) converter, and the first digital signal is a digital voltage signal, and the analog signal is an analog voltage signal.

The control unit 13 is used for elongating the transform time of the analog signal. For example, it originally takes 1 ms to complete a transformation of the analog signal, but now the transform time is elongated to 10 ms, so that the transform amplitude in every 1 ms is reduced in order to obtain the effect of smoothing the signal. A clock generator 18 is electrically coupled to the control unit 13 for splitting signals into such as 1024 bits or 512 bits, or the like. The control unit 13 can be one of a central processor unit (CPU), a microprocessor unit (MPU), or a micro-chip. The second converter 14 is used for converting the analog signal with the elongated transform time into a second digital signal, and the second converter 14 is an analog-to-digital (A/D) converter. The second digital signal is also a digital voltage signal. The second digital signal is amplified by the amplifier circuit 15 and sent to the output terminal 16. The output terminal 16 outputs the amplified second digital signal to control the rotation speed of the DC motor 17 and adjust the focal distance of the digital camera combined within the portable electronic device. Preferably, the DC motor 17 can be a voice coil motor and the amplifier circuit 15 can be either a reverse amplifier circuit or a forward amplifier circuit.

Figure 2A:
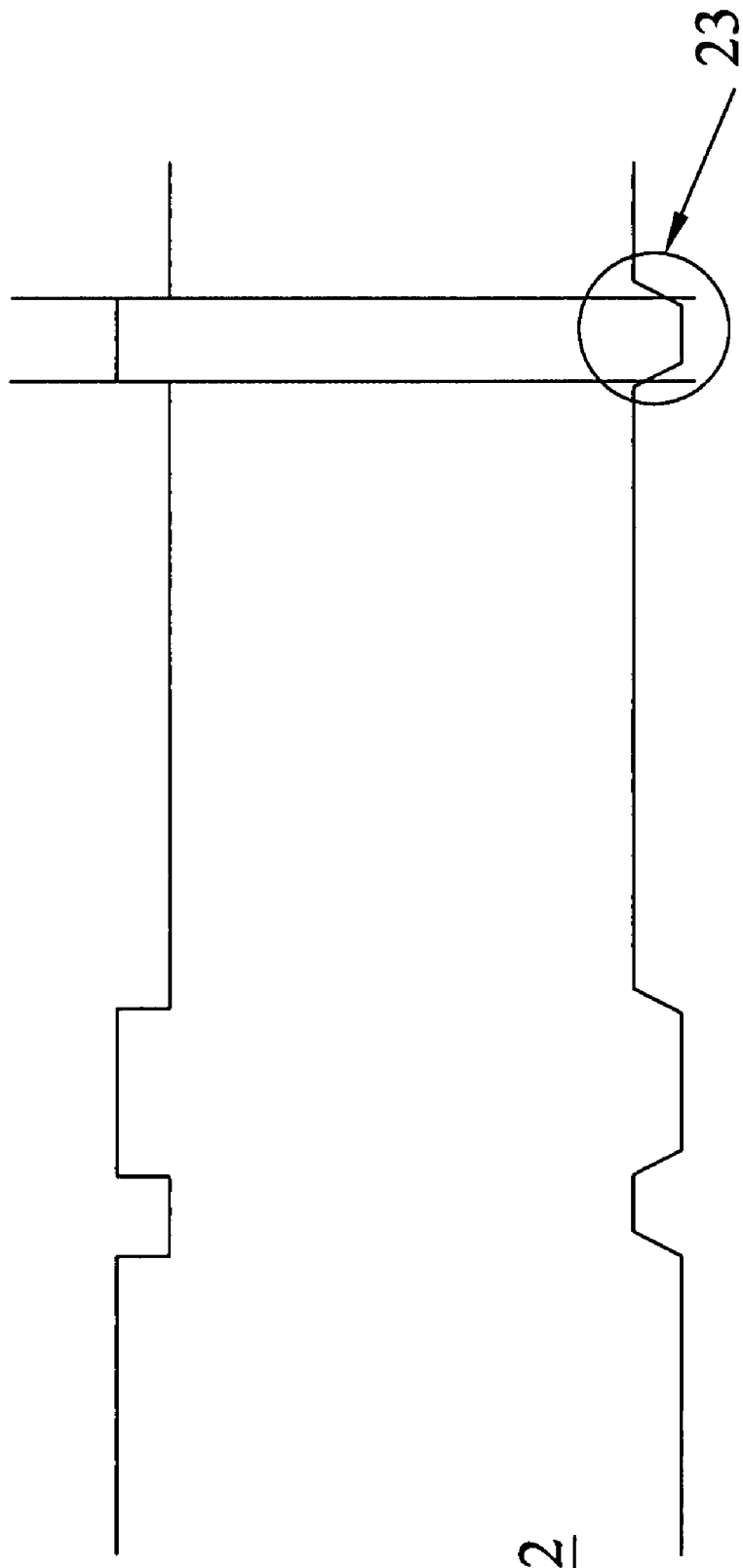
FIG. 2A is a schematic view showing a signal processed in a chip structure capable of smoothing slope of signal during conversion according to the present invention.
Figure 2B:
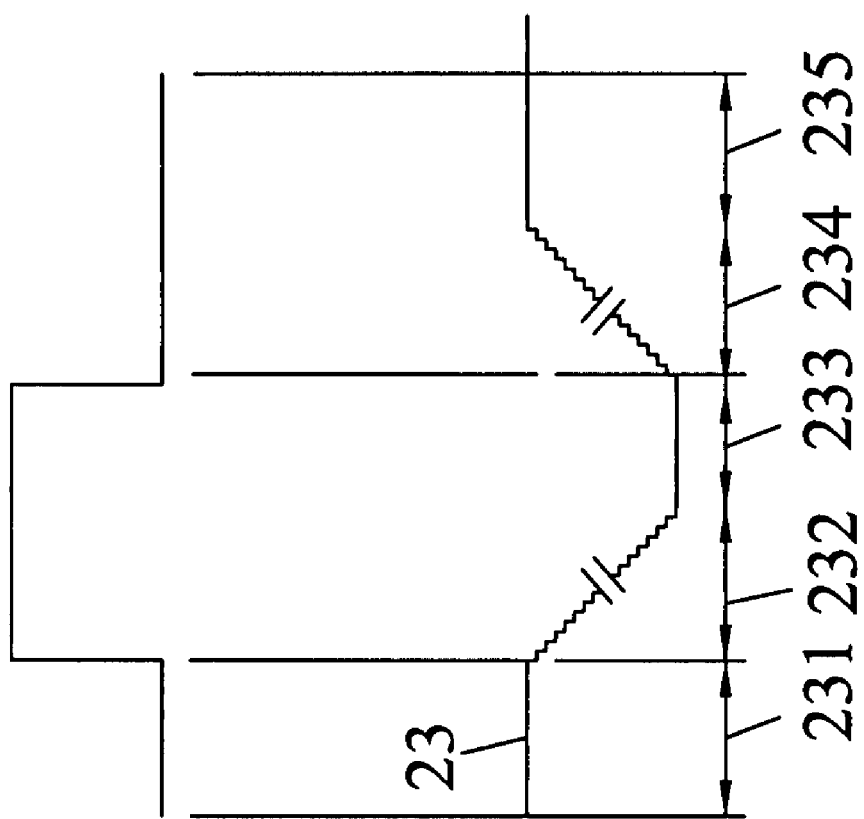
FIG. 2B is a schematic view showing a signal smoothed in a chip structure capable of smoothing slope of signal during conversion according to the present invention.

FIGS. 2A and 2B illustrate respectively a schematic view showing a received signal processed and smoothed in a chip structure capable of smoothing slope of signal during conversion according to the present invention. In FIG. 2A, an input terminal inputs a digital voltage signal. The digital voltage signal. The digital voltage signal is converted into an analog voltage signal 21 via a digital-to-analog converter. A microprocessor unit (MPU) elongates the input time of this signal, such that the analog voltage signal is converted into an analog voltage signal 22 with the elongated input time, so as to smooth the analog voltage signal. Then, an analog-to-digital converter converts the analog voltage signal 22 with the elongated input time into a second digital voltage signal. The second digital voltage signal is amplified via an amplifier and eventually an output terminal outputs the amplified second digital voltage signal to drive a DC motor. The DC motor can be a voice coil motor.

Also referring to FIG. 2B, the analog voltage signal 23 is a steady state signal in a first constant interval 231. When the input terminal delivers a transformed signal related to change from state 1 to state 0, the microprocessor unit would elongate the transform time 232 of the analog voltage signal. For example, it originally takes 1 ms to complete a transformation of the analog voltage signal, but now the transform time is elongated to 10 ms, so that the transform amplitude in every 1 ms is reduced in order to obtain the effect of smoothing the voltage signal. The analog voltage signal is maintained at a steady state in a second constant interval 233. When the input terminal delivers a transformed signal related to change from state 0 to state 1, the microprocessor unit would elongate the second transform time 234. And it is finally maintained at a steady state in a third constant interval 235. Therefore, the effect of smoothing the signal can be achieved by these steps.

The above-described embodiment is only illustrative, but not limitative. Various equivalent modifications or changes to the present invention can be made to the elements of the present invention without departing from the spirit and scope of this invention. Accordingly, all such equivalent modifications and changes shall fall within the scope of the appended claims.

What is claimed is:

1. A chip structure capable of smoothing slope of signal during conversion, which is applied for a DC motor embedded in a portable electronic device, and the DC motor is for adjusting the focal distance of a digital camera installed within the portable electronic device, the chip structure comprising:
    an input terminal for receiving a first digital signal;
    a first converter for converting the amplified first digital signal into an analog signal;
    a control unit for elongating the transform time of the analog signal;
    a second converter for converting the analog signal with the elongated transform time into a second digital signal;
    an amplifier circuit for amplifying the second digital signal; and
    an output terminal for outputting the amplified second digital signal.

2. The chip structure of claim 1, wherein the amplifier circuit is one selected from the group consisting of a forward amplifier circuit and a reverse amplifier circuit.

3. The chip structure of claim 1, wherein the first digital signal is a digital voltage signal.

4. The chip structure of claim 1, wherein the analog signal is an analog voltage signal.

5. The chip structure of claim 1, wherein the second digital signal is a digital voltage signal.

6. The chip structure of claim 1, wherein the control unit is one of a central processor unit (CPU), a microprocessor unit (MPU), or a micro-chip.

7. The chip structure of claim 1, wherein the portable electronic device is a mobile phone, an iPhone, or a personal digital assistant (PDA).

8. The chip structure of claim 1, wherein the DC motor is a voice coil motor.

9. The chip structure of claim 1, wherein the first converter is a digital-to-analog (D/A) converter.

10. The chip structure of claim 1, wherein the second converter is an analog-to-digital (A/D) converter.

\* \* \* \* \*